(12) United States Patent
Peeters et al.

(10) Patent No.: US 10,538,859 B2
(45) Date of Patent: Jan. 21, 2020

(54) METHODS FOR PROVIDING PATTERNED ORIENTATION TEMPLATES FOR SELF-ASSEMBLABLE POLYMERS FOR USE IN DEVICE LITHOGRAPHY

(75) Inventors: Emiel Peeters, Eindhoven (NL); Wilhelmus Sebastianus Marcus Maria Ketelaars, Eindhoven (NL); Johan Frederik Dijksman, Weert (NL); Sander Frederik Wuister, Eindhoven (NL); Roelof Koole, Eindhoven (NL); Christianus Martinus Van Heesch, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 571 days.

(21) Appl. No.: 13/994,426

(22) PCT Filed: Dec. 9, 2011

(86) PCT No.: PCT/EP2011/072379
§ 371 (c)(1),
(2), (4) Date: Jun. 14, 2013

(87) PCT Pub. No.: WO2012/084558
PCT Pub. Date: Jun. 28, 2012

(65) Prior Publication Data
US 2013/0266727 A1    Oct. 10, 2013

Related U.S. Application Data

(60) Provisional application No. 61/426,597, filed on Dec. 23, 2010.

(51) Int. Cl.
*C30B 19/12*    (2006.01)

(52) U.S. Cl.
CPC .................................. *C30B 19/12* (2013.01)

(58) Field of Classification Search
CPC ......... B82Y 10/00; B82Y 40/00; C30B 19/12; G03F 7/0002
(Continued)

(56) References Cited

U.S. PATENT DOCUMENTS

| 6,066,578 A | * | 5/2000 | Gupta | ....................... G03F 7/16 257/E21.027 |
| 7,521,090 B1 | | 4/2009 | Cheng et al. | |

(Continued)

FOREIGN PATENT DOCUMENTS

| WO | 2008/097736 | 8/2008 |
| WO | 2011/073013 | 6/2011 |

(Continued)

OTHER PUBLICATIONS

Asatekin et al. "Designing Polymer Surfaces via Vapor Deposition" Materials Today 13, No. 5 (May 2010) 26-33.*

(Continued)

*Primary Examiner* — Robert S Walters, Jr.
(74) *Attorney, Agent, or Firm* — Pillsbury Winthrop Shaw Pittman LLP

(57) ABSTRACT

A method is disclosed involving depositing a neutral orientation template layer onto a substrate after formation of chemical epitaxy or graphoepitaxy features on the substrate, but before deposition and orientation of a self-assemblable polymer. The orientation layer is arranged to bond with the substrate but not with certain features, so that it may be easily removed by vacuum or rinsing with organic solvent. The neutral orientation layer has a chemical affinity to match that of blocks in the self-assemblable polymer so that blocks of differing types wet the neutral orientation layer so that domains in the self-assembled polymer may lie side by side along the substrate surface, with interfaces normal to the substrate surface. The resulting aligned and oriented self- (Continued)

assembled polymer may itself be used as a resist for device lithography of the substrate.

16 Claims, 7 Drawing Sheets

(58) Field of Classification Search
USPC .......................................................... 427/510
See application file for complete search history.

(56) References Cited

U.S. PATENT DOCUMENTS

| 2008/0318005 | A1 | 12/2008 | Millward | |
|---|---|---|---|---|
| 2010/0167214 | A1 | 7/2010 | Yoon et al. | |
| 2011/0147984 | A1* | 6/2011 | Cheng | B82Y 10/00 |
| | | | | 264/220 |

FOREIGN PATENT DOCUMENTS

| WO | 2011/080016 | 7/2011 |
|---|---|---|
| WO | 2011/128120 | 10/2011 |

OTHER PUBLICATIONS

International Search Report dated May 16, 2012 in corresponding International Patent Application No. PCT/EP2011/072379.

Joy Y. Cheng et al., "Simple and Versatile Methods to Integrate Directed Self-Assembly with Optical Lithography Using a Polarity-Switched Photoresist," ACS Nano, vol. 4, No. 8, pp. 4815-4823 (2010).

Seung Hak Park et al., "Block copolymer multiple patterning integrated with conventional ArF lithography," Soft Matter, vol. 6, pp. 120-125 (2010).

Seong-Jun Jeong et al., "Soft Graphoepitaxy of Block Copolymer Assembly with Disposable Photoresist Confinement," Nano Letters, vol. 9, No. 6, pp. 2300-2305 (2009).

Miri Park et al., "Block Copolymer Lithography: Periodic Arrays of ~$10^{11}$ Holes in 1 Square Centimeter," Science, vol. 276, pp. 1401-1404 (May 30, 1997).

* cited by examiner

METHODS FOR PROVIDING PATTERNED ORIENTATION TEMPLATES FOR SELF-ASSEMBLABLE POLYMERS FOR USE IN DEVICE LITHOGRAPHY

CROSS-REFERENCE TO RELATED APPLICATIONS

This application is the U.S. national phase entry of PCT Patent Application No, PCT/EP2011/072379, filed on Dec. 9, 2011, which claims the benefit of priority of U.S. provisional application 61/426,597, which was filed on Dec. 23, 2010, and which is incorporated herein in its entirety by reference.

FIELD

The invention relates to a method for forming a patterned orientation layer on a surface of a substrate. The invention also relates to formation of a self-assembled polymer layer on such a substrate and a method for device lithography using a resist layer of self-assembled polymer deposited and assembled on such a substrate provided with a patterned orientation layer.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) radiation lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of a surface, for example of an imprint template or of another substrate and a chemical resist may be used to achieve this.

The use of self-assembly of block copolymers (BCPs) has been considered as a potential method for improving the resolution to better values than those obtainable by prior art lithography methods or as an alternative to electron beam lithography for preparation of imprint templates.

Self-assemblable block copolymers are compounds useful in nanofabrication because they may undergo an order-disorder transition on cooling below a certain temperature (order-disorder transition temperature To/d) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification of the chemical compositions of the blocks of the copolymer.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical type monomer, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer (A-B-C) may be useful, as may an alternating or periodic block copolymer (e.g. $[-A-B-A-B-A-B-]_n$ or $[-A-B-C-A-B-C]_m$ where n and m are integers). The blocks are connected to each other by covalent links in a linear or branched fashion (e.g. star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the numbers of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide self-assembly of a polymer such as a block copolymer onto a surface are graphoepitaxy and chemical pre-patterning, also called chemical epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In the chemical pre-patterning method (referred to herein as chemical epitaxy), the self-assembly of block copolymer domains is guided by a chemical pattern (i.e. a chemical template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical pattern comprises a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in a self-assemblable polymer layer, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between domains of different blocks lying substantially perpendicular to the plane of the surface.

A neutral surface is useful in chemical epitaxy and graphoepitaxy. It may be used on a surface between specific orientation regions of an epitaxy template. For instance in a chemical epitaxy template for aligning a di-block copolymer with A and B blocks, where A is hydrophilic and B is hydrophobic in nature, the chemical pattern may comprise hydrophobic pinning regions with a neutral orientation region between the hydrophobic regions. The B domain may preferentially assemble onto the hydrophobic pinning regions, with several alternating domains of A and B blocks aligned over the neutral region between the specific (pinning) orientation regions of the chemical pre-pattern. For instance in a graphoepitaxy template for aligning such a di-block copolymer, the pattern may comprise hydrophobic resist features with a neutral orientation region between the hydrophobic resist features. The B domain may preferentially assemble alongside the hydrophobic resist features, with several alternating domains of A and B blocks aligned over the neutral orientation region between the specific (pinning) orientation resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically 40 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable polymer may be deposited onto the substrate, onto a graphoepitaxy or chemical epitaxy template as set out above. A suitable method for deposition of the self-assemblable polymer is spin coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly.

Self-assembly of a block copolymer is a process where the assembly of many small components (the block copolymer) results in the formation of larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{o/d}$. $T_{o/d}$ may be measured by any suitable technique for assessing the ordered/disordered state of the polymer, such as differential scanning calorimetry (DSC). If layer formation takes place below this temperature, the molecules will be driven to self-assemble. Above the temperature $T_{o/d}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature Tg below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies a temperature up to a few ° C. above or below the order/disorder temperature To/d for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare.

Recently, Jeong et. al. (Nano Letters, 2009, 9(6), 2300) demonstrated that formation of a graphoepitaxy template for alignment of a block copolymer may be achieved by a process wherein a substrate surface is provided with a neutral orientation layer deposited onto a surface of a substrate. Subsequently a resist layer was spin-coated on top of the neutral orientation layer and exposed using conventional deep UV (DUV) radiation lithography (specifically at 193 nm) to pattern the resist using negative tone development (unexposed resist regions are removed with the developer such that the resist features are of exposed resist regions). Finally, a suitable block copolymer was spin-coated on the substrate, with topographic features for graphoepitaxy provided by the resist features with a neutral orientation layer in the spaces between the resist features, and annealed to obtain the ordered and aligned self-assembled polymer layer.

Cheng et al. (ACS Nano, 2010, 4(8), 4815) showed that it is possible to achieve a graphoepitaxy template by starting with a substrate provided with a neutral orientation layer and to spin-coat a photoresist onto the neutral orientation layer. After lithographic exposure of the resist layer, the chemically enhanced photoresist was developed in a negative tone using an organic solvent, resulting in a negative tone resist block pattern (unexposed resist regions are removed with the developer so that the resist features are of exposed resist regions). Subsequently, a suitable copolymer was deposited via spin-coating and annealed.

In the same citation, Cheng et. al. also disclosed a process for formation of a chemical epitaxy template. First, a polarity switched DUV 193 nm photoresist was deposited on a substrate surface provided with a anti-reflection coating (ARC). Following lithographic exposure the chemically enhanced photoresist was developed in a positive tone (exposed resist regions were removed with the developer so that the resist features were of unexposed resist regions). The remaining resist features were trimmed (laterally reduced) to 30 nm line width. Subsequently, a 193 nm flood exposure of actinic radiation and post-exposure bake were applied to harden the resist pattern.

With the resist features still in place on the substrate, a crosslinkable neutral orientation layer was spin-coated onto the substrate and cured (crosslinked), covering exposed substrate areas as well as covering the resist features. Finally, the resist features and the crosslinked neutral orientation layer attached to the resist features, were removed by lift-off development, resulting in a sparse chemical epitaxy template consisting of regions of neutral orientation layer alternating with regions of bare substrate. Subsequently, a suitable block copolymer was deposited via spin-coating and annealed.

Park et. al. (Park et al, Soft Matter, 2010, 6, 120) have reported a different method to obtain a chemical epitaxy template. In this method, a substrate with an ARC has a neutral orientation layer deposited thereon with a positive tone photoresist deposited on the neutral orientation layer. After lithographic exposure and development of the resist, thermal reflow was used to reduce the lateral dimensions of the openings left in the resist layer to the small dimensions that are needed for chemical epitaxy (and which were too small to be achieved directly by optical lithography). Subsequently, the neutral orientation layer was etched away in the narrowed resist openings and the resist stripped to leave the chemical epitaxy template on the substrate. A suitable block copolymer was deposited onto the templated substrate via spin-coating and annealed.

The methods for deposition of a graphoepitaxy template as set out hereinbefore have a disadvantage that a neutral orientation layer is deposited first, before the resist layer is subsequently deposited thereon. This may pose additional requirements on both material and process steps. The resist material to be used has to be compatible with the neutral orientation layer in that the resist layer is required to wet and adhere to the neutral orientation layer. The neutral orientation layer also has to be chemically stable to withstand the process conditions for lithographic patterning of the resist and its subsequent development to leave resist features on the substrate. In general, compounds used for a neutral orientation layer may not be chemically stable when a positive tone resist is used (exposed resist regions are removed with the developer so that the resist features are of unexposed resist regions). This is because the revealed, neutral orientation layer, between remaining resist features, would have been exposed to high energy UV irradiation and harsh conditions (developer solution) during development. Furthermore, improved resolution is achievable where resist is deposited directly onto an appropriate ARC layer rather than onto a neutral orientation layer.

With regard to the methods for chemical epitaxy as set out hereinbefore, the methods for chemical epitaxy set out above may present problems. The method of Cheng et. al. has a potential disadvantage that it involves a lift-off procedure, which is undesirable for semiconductor processing, as it generates risk of contamination of the substrate with particulate matter. Furthermore, the lift-off procedure is typically performed with an aqueous alkaline solvent such as TMAH (tetramethylammonium hydroxide), because the resist features have been hardened and rendered insoluble to organic solvent by a flood exposure to actinic radiation. Such an alkaline TMAH development step is undesirable, because alkaline media may chemically modify the neutral orientation layer thus changing the chemical affinity towards the domains of the self-assemblable polymer. Furthermore, this method results in a chemical pre-pattern consisting of alternating regions of neutral orientation layer and bare substrate as the complementary pattern. This potentially limits the choice of combinations of substrate and self-assemblable polymer, as the bare substrate is required, in this method, to exhibit preferential interaction with one of the blocks.

The method of Park et. al. requires the use of a non-conventional imaging stack that is not optimized for DUV lithography, because of the absence of an ARC layer immediately below the resist. In addition the pitch dependence of thermal reflow (used in the Park method to narrow the photoresist openings) increases process complexity. Again, this method results in a chemical pre-pattern consisting of alternating regions of neutral orientation layer and bare substrate. This limits the choice of potential combinations of substrate and self-assemblable polymer because the bare substrate, used to pin one of the domain types of the self-assemblable polymer, is required to exhibit a high chemical affinity for one of the blocks of the self-assemblable polymer.

An aim of the invention, amongst others, is to provide a method for providing a graphoepitaxy or chemical epitaxy template on a substrate surface, for use in guiding a self-assembled layer of block copolymer as a resist layer suitable for use in device lithography, which addresses or overcomes one or more of the problems identified herein or elsewhere.

Accordingly, an embodiment of the invention relates to a method for forming a patterned orientation layer, as a graphoepitaxy or chemical epitaxy template for orientation of a self-assemblable polymer, on a surface of a substrate. Further, an embodiment of the invention relates to formation of a self-assembled polymer layer on such a substrate and a method for device lithography using a resist layer of self-assembled polymer, such as a block copolymer, deposited and assembled on such a substrate provided with a patterned orientation layer.

Throughout this specification, the term "comprising" or "comprises" means including the component(s) specified but not to the exclusion the presence of others. The term "consisting essentially of" or "consists essentially of" means including the components specified but excludes other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 1% by weight of non-specified components. Whenever appropriate, the use of the term "comprises" or "comprising" may also be taken to include the meaning "consists essentially of" or "consisting essentially of".

An aspect of the invention provides a method of forming a patterned neutral orientation layer, as a template for orientation of a self-assemblable polymer, on a surface of a substrate, the method comprising:

selectively exposing a resist layer on the surface to first actinic radiation to provide exposed and unexposed regions of resist layer;

removing the exposed or unexposed resist regions with a developer to provide the surface having resist features of the remaining resist region thereon; and applying a neutral orientation layer to the surface having resist features thereon, so that the neutral orientation layer is bonded onto the surface between the resist features to provide the patterned neutral orientation layer, wherein the neutral orientation layer is arranged to be unbonded to the resist features and the unbonded neutral orientation layer is removed from the resist features by application of a vacuum or by rinsing with an organic solvent.

In other words, there is provided a method of preparing a surface of a substrate for deposition of self-assemblable polymer thereon, the method comprising: forming a chemical epitaxy or graphoepitaxy template, for alignment of the assembly of the self-assemblable polymer, on the surface, to provide a templated surface, the templated surface comprising resist features thereon, applying to the surface a neutral orientation layer so that the neutral orientation layer is bonded as a patterned neutral orientation layer on the surface between the resist features, wherein the neutral orientation layer is arranged to be unbonded to the resist features and the unbonded neutral orientation layer is removed from the resist features by application of a vacuum or by rinsing with an organic solvent.

The template may be a chemical epitaxy template wherein the resist features are removed following formation of the patterned neutral orientation layer to leave a complementary pattern of a selective orientation layer.

An aspect of the invention provides a method of forming a self-assembled polymer layer on a surface of a substrate, comprising:

providing a surface of a substrate, having a patterned neutral orientation layer thereon, by the method above;

depositing a self-assemblable polymer layer directly onto the neutral orientation layer to provide an interface between the self-assemblable polymer layer and the neutral orientation layer; and treating the self-assemblable polymer layer to provide self-assembly into an ordered polymer layer at the interface.

An aspect of the invention provides a lithography method for patterning a surface of a substrate by resist etching, wherein the method comprises providing an ordered polymer layer at the surface by the method above, wherein the ordered polymer layer is used as a resist layer.

An aspect of the invention provides a method for forming a device topography at a surface of a substrate, the method comprising using the self-assembled polymer layer, formed by a method above, as a resist layer while etching the substrate to provide the device topography.

The following features are applicable to all the various aspects of the invention where appropriate. When suitable, combinations of the following features may be employed as part of the methods and compositions herein, for instance as set out in the claims. The methods and compositions herein are particularly suitable for use in device lithography. For instance the methods and compositions may be used for treatment or formation of a resist layer of self-assembled polymer for use in patterning a device substrate directly or for use in patterning an imprint template for use in imprint lithography.

The self-assemblable polymer may be a block copolymer as set out hereinbefore comprising at least two different block types which are self-assemblable into an ordered polymer layer having the different block types associated into first and second domain types. The block copolymer may be a di-block copolymer or a tri-block or multi-block copolymer. An alternating or periodic block copolymer may be used as the self-assemblable polymer. Although only two domain types may be mentioned in some of the following aspects and examples, an embodiment of the invention is applicable to a self-assemblable polymer with three or more different domain types.

The self-assemblable polymer is desirably a block copolymer comprising one or more first blocks of a first monomer type and one or more second blocks of a second monomer type.

By chemical affinity, in this specification, is meant the tendency of two differing chemical species to associate together. For instance, a chemical species which is hydrophilic in nature has a high chemical affinity for water whereas a hydrophobic compound has a low chemical affinity for water but a high chemical affinity for, for example, an alkane. A chemical species which is polar in nature has a high chemical affinity for another polar compound and for water whereas an apolar, non-polar or hydrophobic compound has a low chemical affinity for water and a polar species but may exhibit high chemical affinity for another non-polar specie such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of an etch rate.

Wherever mention is made of a "layer" in this specification, the layer referred to is to be taken to be a layer of substantially uniform thickness, where present. By "substantially uniform thickness" is meant that the thickness does not vary by more than 10%, desirably not more than 5% of its average value across the layer.

By "bonding" of the neutral orientation layer to a surface it is meant that a bond such as a covalent bond, ionic bond or hydrogen bond is formed between the surface and the neutral orientation layer, i.e. a bond stronger than mere van der Waals attraction. Desirably, the bonding is covalent or ionic bonding, more desirably covalent bonding. By "unbonded" is meant that no bonds other than van der Waals bonding are present.

According to an aspect of the invention, there is provided a method of forming a patterned neutral orientation layer, as a template for orientation of a self-assemblable polymer, on a surface of a substrate.

A resist layer is applied to the surface using a known method such as spin coating.

The resist layer is selectively exposed to first actinic radiation to provide exposed and unexposed regions of resist layer. A conventional lithographic patterning method such as mask or maskless EUV or DUV lithography may be used to provide a desired high resolution exposure pattern, or a method such as electron beam lithography may be employed. Typical DUV lithography is at 193 nm.

One of the exposed or unexposed resist regions is removed with a developer to provide the surface having resist features of the remaining resist region thereon. The developer is chosen to be capable of dissolving or removing one of the exposed or unexposed resist regions while leaving the other region remaining in place on the substrate.

A neutral orientation layer is then applied to the surface having resist features remaining thereon, so that the neutral orientation layer is deposited onto the surface between the resist features and bonded to that surface to provide the patterned neutral orientation layer.

The neutral orientation layer is arranged, as explained herein, to be unbonded to the resist features and the unbonded neutral orientation layer is removed from the resist features by application of a vacuum or by rinsing with a suitable solvent such as an organic solvent.

Combinations of resist and developer are known in the art for both positive tone development (where exposed resist regions are removed with the developer so that the resist features are of unexposed resist regions), and for negative tone development (where unexposed resist regions are removed with the developer so that the resist features are of exposed resist regions).

The exposed resist regions may be removed with the developer so that the resist features are of unexposed resist regions. Alternatively, the unexposed resist regions may be removed with the developer so that the resist features are of exposed resist regions.

The first actinic radiation may suitably be DUV or EUV radiation. The selective exposure to first actinic radiation may be by patterning of the EUV or DUV radiation with a lithography apparatus.

The substrate may have an anti-reflection coating for the actinic radiation at the surface.

A primer layer may be provided on the surface and the resist layer applied onto the primer layer. Residual primer may be removed from the surface between the resist features prior to application of the neutral orientation layer. For instance, the residual primer may be removed by treatment with an oxygen, for instance as a plasma or by UV generated ozone.

The resist features remaining after development may be exposed to a second actinic radiation and/or to thermal treatment such as baking either prior to application of the neutral orientation layer, or after application of the neutral orientation layer, so that the resist features are rendered chemically modified such as rendered less soluble to an organic solvent or rendered of a different chemical affinity, for instance converted from a hydrophobic to hydrophilic chemical affinity. The second actinic radiation may be the same as the first actinic radiation but applied at a different level of intensity or for a different length of time or both. Typically, the resist features may be exposed to a second actinic radiation following application of the neutral orientation layer so that the resist features are rendered chemically modified. This chemical modification may render the resist features selective to a particular domain type of a self-assemblable polymer. A chemically enhanced resist is typically apolar when unexposed. After exposure, acidic groups in the resist are made active and during heat treatment the resist may be rendered hydrophilic.

The neutral orientation layer is applied by any suitable method such as spin coating or spraying, but vapor deposition may be particularly suitable. The neutral orientation layer may comprise or consist essentially of an organic compound having a reactive head group. This organic compound may have a tail group such as a hydrocarbon (e.g. alkyl or aryl) or polymer moiety having a chemical affinity for the different blocks of the self-assemblable polymer, combined with a reactive head group adapted to bond the organic compound to the surface of the substrate. For instance the reactive head group may suitably be a reactive substituted silane head group. An appropriate substituted silane may react with a hydroxyl group on the substrate surface to form a covalent linkage of the organic compound having a reactive substituted silane head group with the surface. The reactive head group may be, but is not limited to, trichlorosilane, trimethoxysilane, triethoxysilane, methyldimethoxysilane, methyldiethoxysilane, methyldichlorosilane, dimethylchlorosilane, dimethylmethoxysilane or dimethylethoxysilane. The tail can be a wide variety of chemical moieties, including a linear, branched or cyclic alkyl, an aromatic or heterocyclic moiety, an ether or ester moiety, a polymer chain, or so on.

Mixtures of organic compounds having reactive substituted silane head groups may be employed.

A suitable organic compound having a reactive substituted silane head group for use as a compound for use in forming the neutral orientation layer is 3-(p-methoxyphenyl) propyl trichlorosilane. This may suitably be applied to the surface of the substrate by vapor deposition. It is particularly useful for use as a neutral orientation layer with a cylindrical or lamellar phase poly(styrene-b-methylmethacrylate) block copolymer.

Unreacted orientation layer, which is unbonded to the resist features, may suitably be removed from the resist features by application of a vacuum or by rinsing with a solvent, such as an organic solvent, so that the resist features remain in place on the surface. The resist features may remain in place on the surface as part of the template for orientation of the self-assemblable polymer. This arrangement, where resist features remain on the surface of the substrate, is useful where a graphoepitaxy substrate for self-assembly is used, with the resist features acting to locate or pin a particular domain type and the neutral orientation layer allowing alternating domain types to be formed over it.

The resist features may be removed following application of the patterned neutral orientation layer so that a complementary pattern free from orientation layer is formed where the resist features have been removed. This is useful where the substrate is to be provided with a chemical epitaxy template by a method according to an embodiment of the invention. This complementary pattern may act as a selective orientation layer. The resist features may be removed by dissolution in a solvent such as an organic solvent.

The resist features may be laterally trimmed prior to application of the neutral orientation layer so that the dimension of features of the complementary pattern are correspondingly reduced in lateral extent. This may be achieved by a known trimming method. Typically, isotropic etching of the resist features may be used for trimming.

A selective orientation layer may be applied to the surface prior to applying the resist layer to the surface, the selective orientation layer having a chemical affinity differing from that of the neutral orientation layer. The selective orientation layer may be removed from the surface between the resist features prior to application of the neutral orientation layer.

The surface between the resist features may be treated with oxygen following removal of the selective orientation layer and prior to application of the neutral orientation layer, for instance by treatment with oxygen (e.g. plasma or UV/ozone)

According to an aspect, there is provided a method of forming a self-assembled polymer layer on a surface of a substrate. The surface of the substrate is provided with a patterned neutral orientation layer thereon, by the method of an embodiment of the invention as set out above.

The self-assemblable polymer layer is deposited directly onto the neutral orientation layer to provide an interface between the self-assemblable polymer layer and the neutral orientation layer. The self-assemblable polymer layer is treated to provide self-assembly into an ordered polymer layer at the interface. The self-assemblable polymer may comprise first and second domain types wherein the neutral orientation layer has chemical compatibility with both first and second domain types so that both first and second domain types are present at the interface.

The surface of the substrate may have features provided thereon to pin or orient a domain type of the self-assemblable polymer. For instance, when a chemical epitaxy template having a complementary pattern free from neutral orientation layer is provided by the method according to an embodiment of the invention as set out hereinbefore, the surface within the complementary pattern free from neutral orientation layer may have a chemical compatibility with the first domain type and not the second domain type so that the self-assembled polymer is formed with regions of the first domain located in contact with the surface within the complementary pattern. In other words, the complementary pattern may act as a selective orientation layer to pin the nucleation of the first domain type as the self-assemblable polymer is oriented on the surface of the substrate.

BRIEF DESCRIPTION OF THE DRAWINGS

Specific embodiments of the invention will be described with reference to the accompanying figures, in which.

DETAILED DESCRIPTION

Figure 1A:
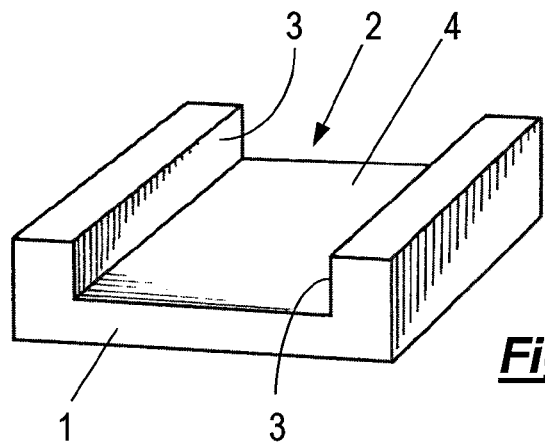
FIGS. 1A to 1C schematically depict a directed self-assembly of A-B block copolymers onto a substrate by graphoepitaxy and formation of relief patterns by selective etching of one domain.
Figure 1B:
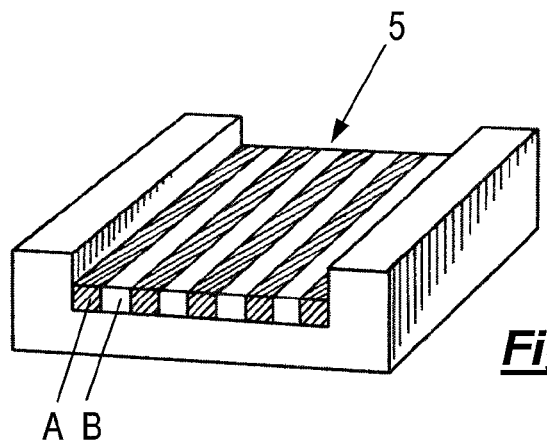
Figure 1C:
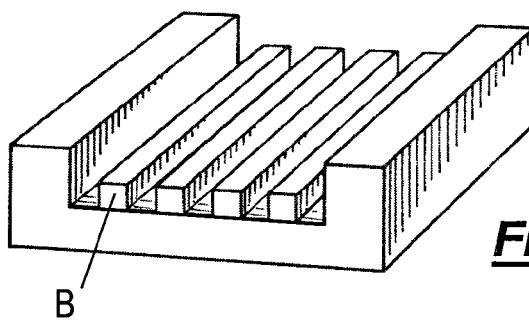

FIG. 1A shows a substrate 1 with a trench 2 formed therein bounded by one or more side walls 3 and a bottom surface 4. In FIG. 1B, a self-assemblable A-B block copolymer with lyophilic (e.g., hydrophilic) A blocks and lyophobic (e.g., hydrophobic) B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the side wall 3, which is also lyophilic (e.g., hydrophilic). In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each or the side wall.

Figure 2A:
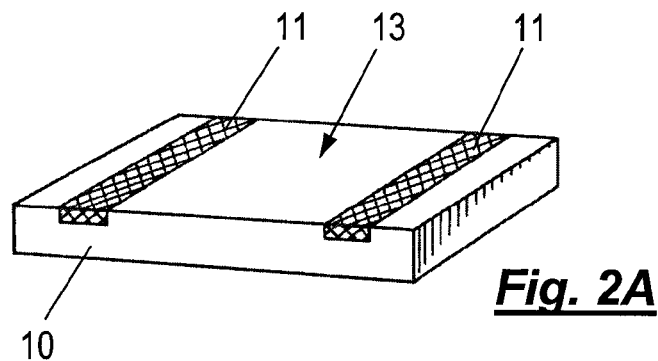
FIGS. 2A to 2C schematically a directed self-assembly of A-B block copolymers onto a substrate by chemical pre-patterning and formation of relief patterns by selective etching of one domain.
Figure 2B:
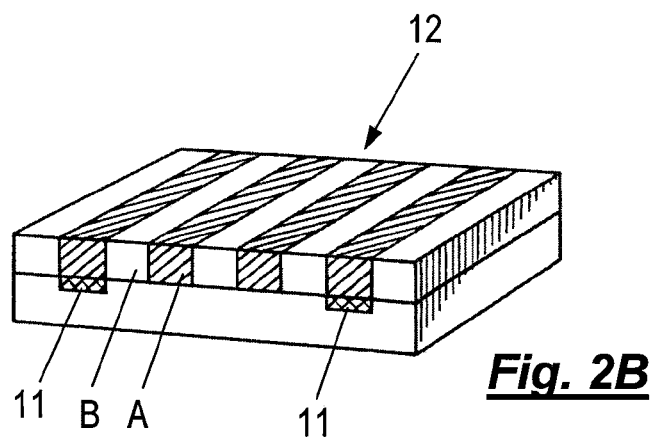
Figure 2C:
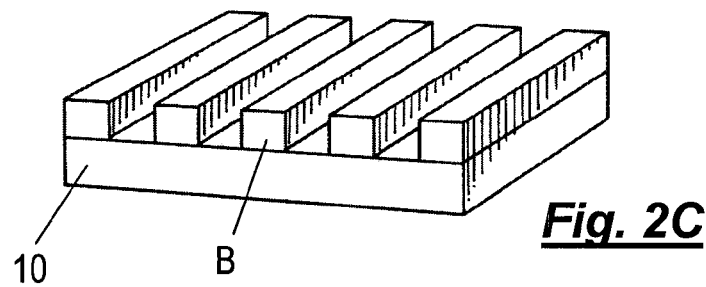

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with lyophilic (e.g., hydrophilic) A blocks and lyophobic (e.g., hydrophobic) B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A domains have nucleated atop the pinning stripes 11, which are also lyophilic (e.g., hydrophilic). In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

In the following, the di-block copolymer used as self-assemblable polymer is poly(styrene-b-methylmethacrylate) block copolymer.

Figure 3A:
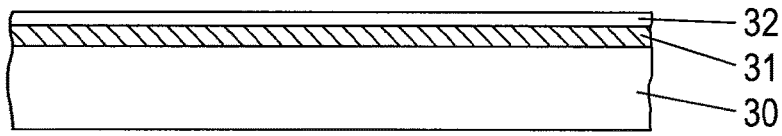
FIGS. 3A to 3F schematically depict cross sectional views of a substrate undergoing a process involving forming a graphoepitaxy template on a substrate, and assembling a self-assemblable di-block copolymer thereon, according to an embodiment of the invention.
Figure 3B:
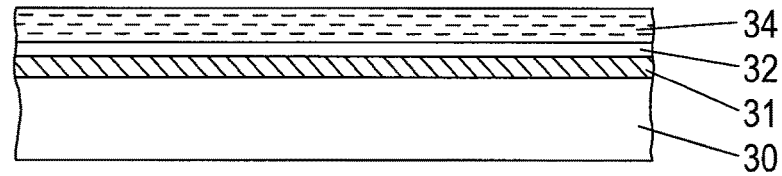
Figure 3C:
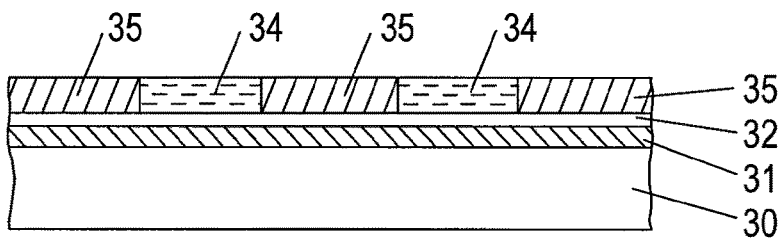
Figure 3D:
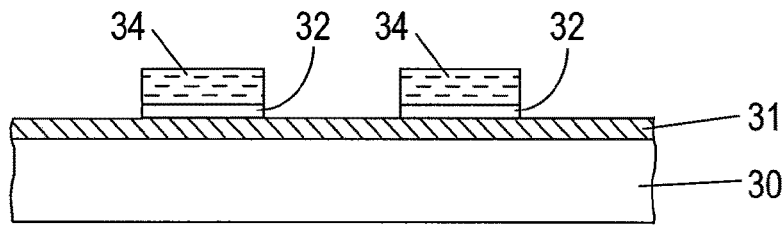
Figure 3E:
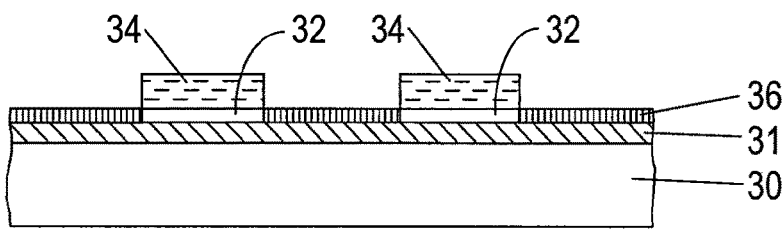
Figure 3F:
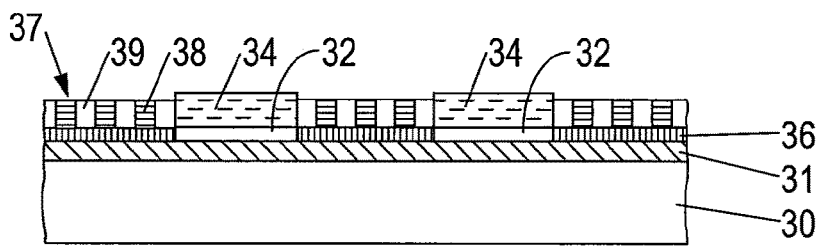

Turning to FIGS. 3A to 3F, these depict a substrate undergoing a process, according to an embodiment of the invention, involving forming a graphoepitaxy template on the substrate, in FIGS. 3A to 3E, and assembling a self-assemblable di-block copolymer thereon in FIG. 3F.

A substrate 30 with an appropriate ARC layer 31 is provided with a primer layer 32 after which a 193 nm (DUV) chemically enhanced resist layer 34 is deposited via spin-coating. The primer layer 32 allows the resist 34 to wet the ARC layer 31 and so allows the choice of resist to be independent of the chemical affinity of the ARC layer 31. A pattern of exposed regions 35 and unexposed regions 34 is generated into the resist layer 34 by, for example, 193 nm DUV water immersion lithography and subsequent positive tone development so that the exposed resist 35 is removed from the ARC layer 31 by a developer, leaving a topographic pattern of unexposed resist 34. The ARC layer 31, with the layers thereon, is then exposed to a flood exposure with 193 nm DUV actinic radiation and baked to harden the resist features 34 and render them lyophilic (e.g., hydrophilic) and insoluble to an organic solvent. The primer layer 32 is unstable towards 193 nm radiation and positive tone developer, but if necessary, the substrate may be exposed to a mild oxygen treatment (plasma or UV/ozone for instance) to remove residual primer layer 32 and to activate the bare substrate surface.

Subsequently a silane compound, with a reactive silane headgroup, such as 3-(p-methoxyphenyl)propyltrichlorosilane, is applied to and reacts to bond with the activated surface via vapor deposition to provide neutral orientation layer 36. Unreacted silane compound remains unbonded to resist features and is removed by vacuum or by rinsing with organic solvent to which the residual resist features 34 have been rendered insoluble.

The self-assemblable block copolymer 37 is applied via spin-coating and subsequently annealed via thermal treatment or solvent annealing to self-assemble into domains 38, 39. In this embodiment, the domains of one type 39 align against the side walls of the residual resist features 34 with alternating strips of the domains 38, 39 aligned side-by-side on the neutral orientation layer 36 between the resist features 34.

In another embodiment of the invention involving forming a graphoepitaxy template on a substrate, also depicted in the FIGS. 3A to 3E, a wafer with appropriate anti-reflection coating 31 may be provided with a primer layer 32 after which a 193 nm chemically enhanced DUV resist layer 34 is deposited via spin-coating. A pattern of exposed 35 and unexposed resist regions 34 is generated into the resist layer by 193 nm water immersion lithography and subsequent positive tone development so that the exposed resist 35 is removed from the substrate leaving a topographic pattern of unexposed resist as resist features 34. The primer is unstable towards 193 nm radiation and positive tone developer, but if needed, the ARC layer 31 may be exposed to a mild oxygen plasma treatment to remove any residual primer layer 32, and to activate the surface of the exposed ARC layer 31 so that it is receptive to chemical bonding of the subsequently applied neutral orientation layer.

Subsequently a silane compound, with a reactive silane headgroup, such as 3-(p-methoxyphenyl)propyltrichlorosilane, is applied to and reacts to bond with the activated surface via vapor deposition to provide neutral orientation layer 36. Unreacted silane compound is removed by vacuum or by rinsing rinse with organic solvent to which the residual resist features 34 have been rendered insoluble.

Thereafter the substrate 30 is exposed to a flood exposure of UV radiation and subjected to a post-exposure bake in order to render the remaining resist features 34 hardened and to render the resist features 34 more hydrophilic and insoluble to organic solvents. This differs from the previous embodiment set out above in that the resist may be hydrophobic at the time of application of the neutral orientation layer, so that the molecules forming the neutral orientation layer do not chemically bond to the remaining resist features. After further treatment by exposure to second actinic radiation and/or post exposure bake, the hydrophilic nature of the resist features 34 enables them to act as preferential nucleation sites (selective orientation) for the more hydrophilic domains 39 of the self-assemblable polymer 37. A layer of self-assemblable di-block copolymer 37 is applied via spin-coating and subsequently annealed via thermal treatment or solvent annealing, with the hydrophilic domains 39 pinning to the side walls of the resist features 35 and alternating domains 38, 39 side-by-side over the neutral orientation layer 36 between the resist features 34.

In another embodiment for formation of a graphoepitaxy template, the method may be as set out for the embodiment described hereinbefore, but a pattern of exposed and unexposed regions is generated into the resist layer 34 by, for example, 193 nm water immersion lithography and subsequent negative tone development with organic solvent removes the unexposed resist from the substrate leaving a topographic pattern of exposed resist. The other process steps remain as for any of the embodiments as already set out.

In another embodiment using negative tone development, the process of the invention may be realized as set out for the previous embodiment, but using a 365 nm I-line negative tone resist layer deposited by spin-coating, as the resist layer. A pattern is generated into the resist layer by 365 nm I-line projection photolithography and subsequent negative tone development with organic solvent removes the unexposed resist from the substrate leaving a topographic pattern of exposed resist. The other steps are carried out as set out in any of the other embodiments.

Figure 4A:
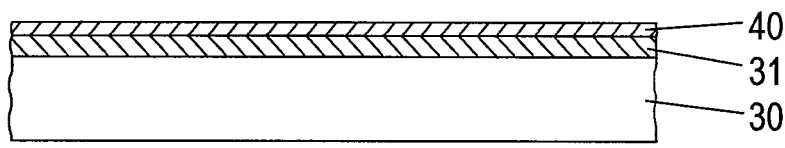
FIGS. 4A to 4H schematically depict cross sectional views of a substrate undergoing a process involving forming a chemical epitaxy template on a substrate, and assembling a self-assemblable di-block copolymer thereon, according to an embodiment of the invention.
Figure 4B:
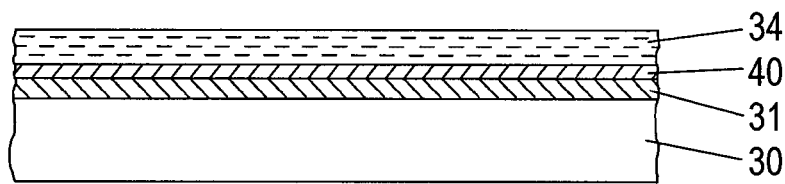
Figure 4C:
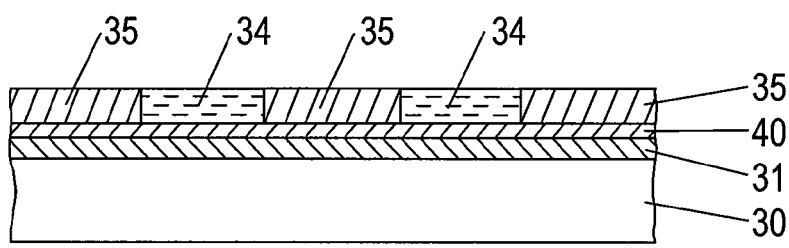
Figure 4D:
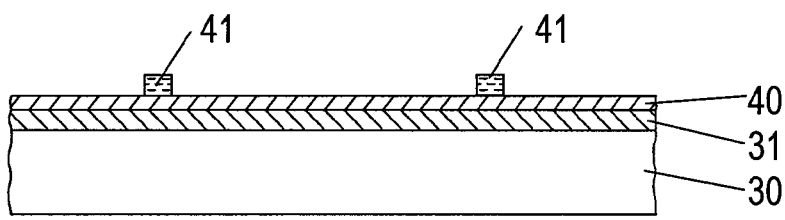
Figure 4E:
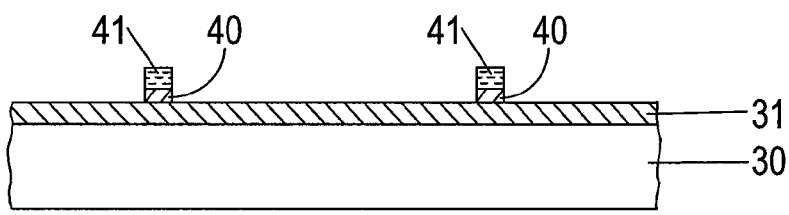
Figure 4F:
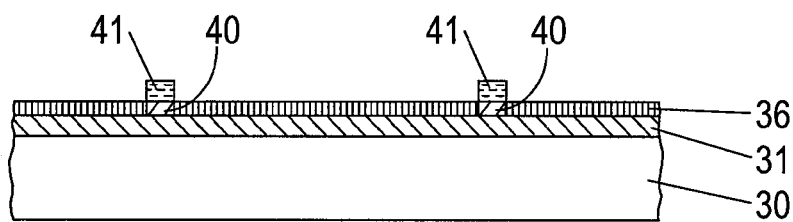
Figure 4G:
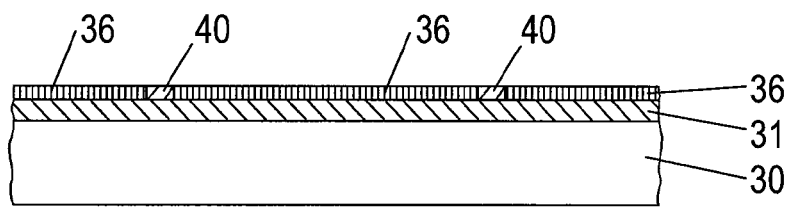
Figure 4H:
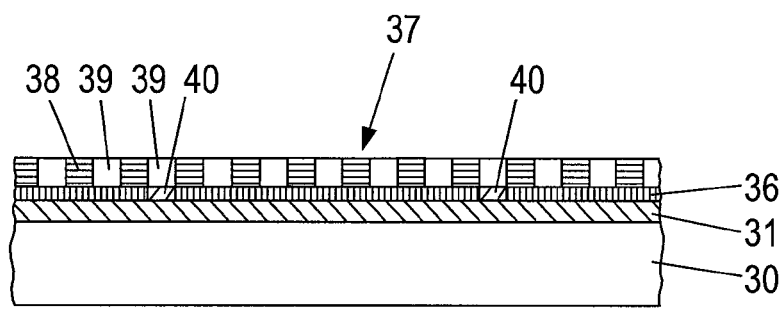

FIGS. 4A to 4H depict a substrate undergoing a process, according to an embodiment of the invention, involving forming a chemical epitaxy template on the substrate in FIGS. 4A to 4G, and assembling a self-assemblable di-block copolymer thereon in FIG. 4H.

A substrate 30 with an appropriate ARC layer 31 is provided with a selective orientation layer 40 of a compound having a high chemical affinity for one of the domains 39 of the self-assemblable di-block copolymer 37 to be applied later. The selective orientation layer 40 has low chemical affinity for the other domain 38.

This selective orientation layer 40 may be a brush polymer that can be applied by spin-coating and thermal curing to react terminal hydroxyl groups of the brush polymer with the ARC layer 31 to provide bonding, after which unreacted brush polymer may be removed from resist features by rinsing with an organic solvent. Alternatively, for instance, the selective orientation layer 40 may be a crosslinkable polymer that is applied via spin-coating and that is cured by thermal treatment or by photo-crosslinking. In another arrangement, this selective orientation layer may be a layer, for instance a monolayer of a first silane compound with a reactive silane headgroup, applied via vapor deposition or spin-coating (an appropriate silane would have a reactive substituted silane headgroup that can react, for instance, with hydroxyl groups on the substrate surface to form a covalent linkage between the Si of the silane headgroup and the surface and a "tail" that shows preferential interaction with one of the blocks of the self-assemblable polymer).

After provision of the selective orientation layer 40, a 193 nm (DUV) chemically enhanced resist layer 34 is deposited onto the selective orientation layer 40 for instance by spin-coating. A pattern of exposed regions 35 and unexposed regions 34 is generated in the resist layer by, for example, 193 nm water immersion lithography and subsequent positive tone development of the resist layer, so that the exposed resist 35 is removed from the substrate 30 leaving a topographic pattern of unexposed resist 34. In this manner, the underlying selective orientation layer 40, which will eventually remain as part of the chemical epitaxy template, is not exposed to the 193 nm DUV radiation, thereby not risking actinic modification of the chemical properties of selective orientation layer 40.

The remaining resist features 34 are trimmed to reduce their lateral extent to obtain trimmed resist features 41 having the desired dimension for pinning regions of the selective orientation layer for a chemical epitaxy template. This trimming allows the formation of complementary pattern features of dimension smaller than those attainable solely by DUV lithography. The bared regions of selective orientation layer 40 are subsequently removed in the uncovered areas by etching with an appropriate etch composition, and the exposed substrate surface (ARC layer 31) is activated by a mild oxygen plasma treatment.

Subsequently, a neutral orientation layer 36 is applied and reacts to bond with the activated surface, in this example by vapor deposition of a second reactive silane compound (although another neutral orientation layer may be employed to bond as set out hereinbefore). An appropriate second reactive silane compound comprises a "reactive headgroup" that can react with a hydroxyl group on the substrate surface to form a covalent linkage of the silane with the surface and a "tail", that is neutral to, i.e. has a similar chemical affinity with, both blocks of the di-block copolymer, so that domains of each block type can be ordered in a side-by-side manner on the neutral orientation layer 36.

The resist features (along with any unbonded second reactive silane compound which does not bond to the resist features) are subsequently removed by rinsing the substrate with a suitable organic solvent, resulting in the desired chemical pre-pattern template with alternating regions of a pattern of neutral orientation layer 36 and a complementary pattern of selective orientation layer 40. By rinsing with an organic solvent, both the first and second silane compounds are chemically unmodified, in contrast to the TMAH development step of the prior methods.

Finally, a self-assemblable block copolymer layer 37 is applied via spin-coating, as shown in FIG. 4H, and subsequently annealed via thermal treatment or solvent annealing so that the domains 39 align desirably over the complementary pattern of selective orientation layer 40, with alternating domains 38, 39 overlying the pattern of neutral orientation layer 36.

In FIGS. 5A to 5G, an embodiment of the invention is depicted wherein the ARC layer 31 acts as a selective orientation layer having a high chemical affinity for one of the blocks of the di-block copolymer. In this situation, exposed areas of ARC may act as pinning points in a complementary pattern of a chemical epitaxy template.

Figure 5A:
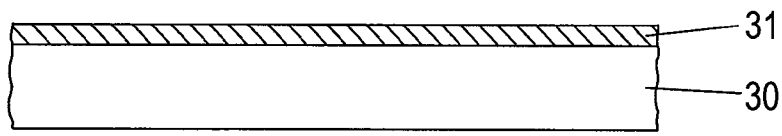
FIGS. 5A to 5G schematically depict cross sectional views of a substrate undergoing a process involving forming a chemical epitaxy template on a substrate, and assembling a self-assemblable di-block copolymer thereon, according to an embodiment of the invention.
Figure 5B:
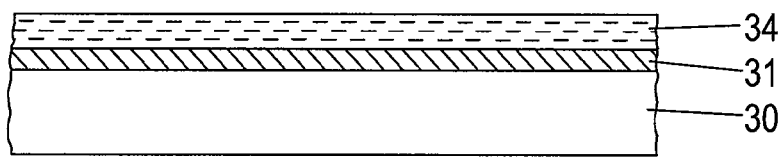
Figure 5C:
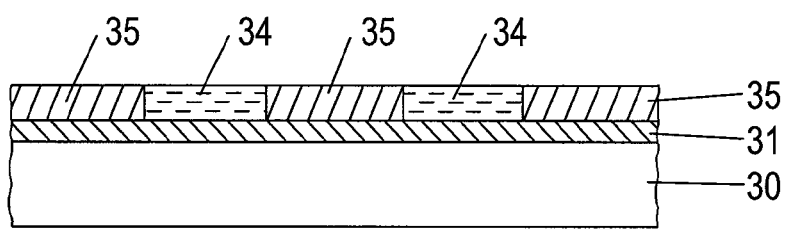
Figure 5D:
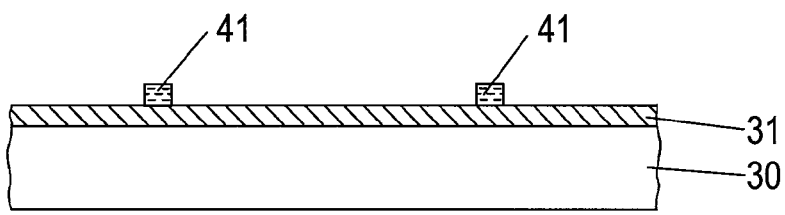
Figure 5E:
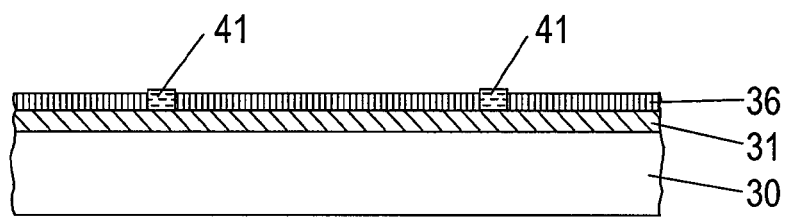
Figure 5F:
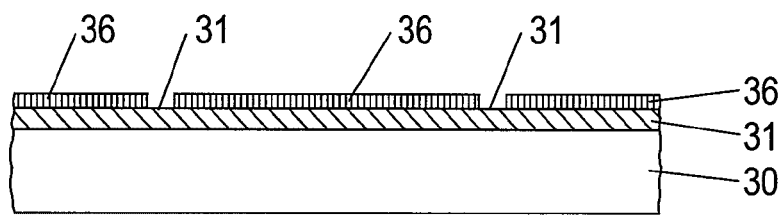

Turning to FIG. 5A, a substrate 30 with an appropriate ARC layer 31 is provided with a 193 nm (DUV) chemically enhanced resist layer 34 via spin-coating as shown in FIG. 5B. A pattern of exposed resist regions 35 and unexposed resist regions 34 is generated into the resist layer 34 by, for example, 193 nm water immersion lithography and subsequent positive tone development, so that the exposed resist 35 is removed from the substrate leaving resist features 34 of unexposed resist. The remaining resist features 34 are trimmed to reduce their lateral extent to obtain trimmed resist features 41 having the desired dimension for pinning regions of the selective orientation layer for a chemical epitaxy template.

Subsequently, a neutral orientation layer 36 is applied and reacts to bond with the activated surface, in this example by vapor deposition of a second reactive silane compound. An appropriate second reactive silane compound comprises a "reactive headgroup" that can react with a hydroxyl group on the substrate surface to form a covalent linkage of the silane with the surface and a "tail", that is neutral to, i.e. has a similar chemical affinity with, both blocks of the di-block copolymer, so that domains of each block type can be ordered in a side-by-side manner on the neutral orientation layer 36.

The trimmed resist features 41 (as well as unbonded reactive silane molecules, which will not bond to the resist features) are subsequently removed by rinsing the substrate 30 with an organic solvent, leaving in place the desired chemical graphoepitaxy template of a pattern of neutral orientation layer 36 and a complementary pattern of exposed ARC layer 31 acting as selective orientation layer.

Figure 5G:
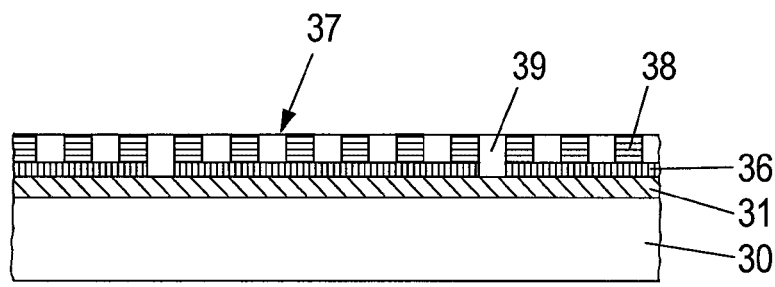

Finally, as depicted in FIG. 5G, a self-assemblable diblock copolymer layer 37 is applied via spin-coating and subsequently annealed via thermal treatment or solvent annealing so that the domains 39 align desirably over the complementary pattern of selective orientation layer of ARC 31 with alternating domains 38, 39 overlying the pattern of neutral orientation layer 36.

The described and illustrated embodiments are to be considered as illustrative and not restrictive in character, it being understood that only preferred embodiments have been shown and/or described and that all changes and modifications that come within the scope of the inventions as defined in the claims are desired to be protected. For instance, any suitable molecule or deposition method may be used for the application of the neutral orientation layer. For instance, EUV lithography may be used, employing a suitable resist layer 34, rather than DUV lithography as mentioned in the embodiments set out.

The embodiments of the invention allow for formation onto a substrate of a chemical pre-pattern template or a graphoepitaxy template without any particular limitations on the combinations of substrate and self-assemblable polymer to be aligned using the template. Furthermore, the embodiments of the invention do not require complex and/or undesirable process steps such as thermal reflow or lift-off etch processes for removal of residual resist. Nor is there any requirement, in the embodiments of the invention, for exposure of an orientation layer to an undesirable aqueous alkaline development solvent such as TMAH. Nor, in embodiments of the invention where positive tone development is used, is there any requirement for an orientation layer to be directly or indirectly exposed to actinic radiation such as 193 nm DUV radiation.

The present invention relates to lithography methods. The methods may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. The invention is also of use to create regular nanostructures on a surface for use in the fabrication of integrated circuits, bit-patterned media and/or discrete track media for magnetic storage devices (e.g. for hard drives).

In particular, the invention is of use for high resolution lithography, where features patterned onto a substrate have a feature width or critical dimension of about 1 μm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

In this specification, the term "substrate" is meant to include any surface layer forming part of the substrate, or being provided on a substrate, such as one or more planarization layers or anti-reflection coating layers which may be at, or form, the surface of the substrate.

Further embodiments according the invention are provided in below numbered clauses:

1. A method of forming a patterned neutral orientation layer, as a template for orientation of a self-assemblable polymer, on a surface of a substrate, the method comprising:

selectively exposing a resist layer on the surface to first actinic radiation to provide exposed and unexposed regions of resist layer;

removing one of the exposed or unexposed resist regions with a developer to provide the surface having resist features of the remaining resist region thereon; and applying a neutral orientation layer to the surface having resist features thereon, so that the neutral orientation layer is bonded onto the surface between the resist features to provide the patterned neutral orientation layer, wherein the neutral orientation layer is arranged to be unbonded to the resist features and the unbonded neutral orientation layer is removed from the resist features by application of a vacuum or by rinsing with an organic solvent.

2. The method of clause 1, wherein the exposed resist regions are removed with the developer so that the resist features are of unexposed resist regions.

3. The method of clause 1, wherein the unexposed resist regions are removed with the developer so that the resist features are of exposed resist regions.

4. The method of any preceding clause, wherein the first actinic radiation is DUV or EUV radiation.

5. The method of clause 4, wherein the selective exposure to first actinic radiation is by patterning of the EUV or DUV radiation with a lithography apparatus.

6. The method of any preceding clause, wherein the substrate has an anti-reflection coating for the actinic radiation at the surface.

7. The method of any preceding clause, wherein a primer layer is provided on the surface and the resist layer is applied on the primer layer.

8. The method of clause 7, wherein residual primer layer is removed from the surface between the resist features prior to application of the neutral orientation layer.

9. The method of clause 8, wherein the residual primer layer is removed by treatment with oxygen.

10. The method of any preceding clause, wherein the resist features remain in place on the surface as part of the template for orientation of the self-assemblable polymer.

11. The method of any preceding clause, wherein the resist features are exposed to a second actinic radiation following application of the neutral orientation layer so that the resist features are rendered chemically modified.

12. The method of any preceding clause, wherein the neutral orientation layer is applied by vapor deposition.

13. The method of clause 12, wherein the neutral orientation layer comprises an organic compound having a reactive substituted silane head group.

14. The method of clause 13, wherein the organic compound having a reactive substituted silane head group is 3-(p-methoxyphenyl)propyltrichlorosilane.

15. The method of any of clauses 1 to 9, wherein the resist features are removed following application of the patterned neutral orientation layer so that a complementary pattern free from orientation layer is formed where the resist features have been removed.

16. The method of clause 15, wherein the resist features are removed by dissolution in an organic solvent.

17. The method of clause 15 or clause 16, wherein the resist features are laterally trimmed prior to application of the neutral orientation layer so that the dimension of features of the complementary pattern are correspondingly reduced in lateral extent.

18. The method of any of clauses 15 to 17, wherein a selective orientation layer is applied to the surface prior to applying the resist layer to the surface, the selective orientation layer having a chemical affinity differing from that of the neutral orientation layer.

19. The method of clause 18, wherein the selective orientation layer is removed from the surface between the resist features prior to application of the neutral orientation layer.

20. The method of clause 19, wherein the surface between the resist features is treated with oxygen following removal of the selective orientation layer and prior to application of the neutral orientation layer.

21. A method of preparing a surface of a substrate for deposition of self-assemblable polymer thereon, the method comprising:
    forming a chemical epitaxy or graphoepitaxy template, for alignment of the assembly of the self-assemblable polymer, on the surface, to provide a templated surface, the templated surface comprising resist features thereon; and
    applying to the surface a neutral orientation layer so that the neutral orientation layer is deposited as a patterned neutral orientation layer on the surface between the resist features,
    wherein the neutral orientation layer is arranged to be unbonded to the resist features and the unbonded neutral orientation layer is removed from the resist features by application of a vacuum or by rinsing with an organic solvent.

22. The method of clause 21, wherein the template is a chemical epitaxy template and wherein the resist features are removed following formation of the patterned neutral orientation layer to leave a complementary pattern of a selective orientation layer.

23. A method of forming a self-assembled polymer layer on a surface of a substrate, comprising:
    providing a surface of a substrate, having a patterned neutral orientation layer thereon, by the method of any preceding clause;
    depositing a self-assemblable polymer layer directly onto the neutral orientation layer to provide an interface between the self-assemblable polymer layer and the neutral orientation layer; and
    treating the self-assemblable polymer layer to provide self-assembly into an ordered polymer layer at the interface.

24. The method of clause 23, wherein the self-assemblable polymer comprises first and second domain types and wherein the neutral orientation layer has chemical compatibility with both first and second domain types so that both first and second domain types are present at the interface.

25. The method of clause 24 when dependent on any of clauses 15 to 20 or clause 22, wherein the surface within the complementary pattern free from orientation layer has chemical compatibility with the first domain type and not the second domain type so that the self-assembled polymer is formed with regions of the first domain located in contact with the surface within the complementary pattern.

26. A lithography method for patterning a surface of a substrate by resist etching, wherein the method comprises providing an ordered polymer layer at the surface by the method of any of clauses 23 to 25, wherein the ordered polymer layer is used as a resist layer.

27. A method for forming a device topography at a surface of a substrate, the method comprising using the self-assembled polymer layer formed by the method of any of clauses 23 to 25 as a resist layer while etching the substrate to provide the device topography.

The invention claimed is:

1. A method of forming a patterned neutral orientation layer, as a template for orientation of a self-assemblable polymer having different blocks, on a substrate, the method comprising:
    applying a material to a surface of the substrate to form a neutral orientation layer, the surface having resist features thereon, so that the neutral orientation layer is bonded onto the surface between the resist features to provide the patterned neutral orientation layer, the neutral orientation layer having a similar chemical affinity for different blocks of the self-assemblable polymer and the material to form the neutral orientation layer comprising an organic compound having a head group reactive with the surface between the resist features,
    wherein the material to form the neutral orientation layer is arranged to be unbonded to the resist features and such unbonded material is removed off the substrate by application of a vacuum or by rinsing with an organic solvent.

2. The method of claim 1, wherein the resist features remain in place on the surface as part of the template for orientation of the self-assemblable polymer.

3. The method of claim 1, wherein the resist features are exposed to actinic radiation following application of the neutral orientation layer so that the resist features are rendered chemically modified.

4. The method of claim 1, wherein the material to form the neutral orientation layer is applied by vapor deposition.

5. The method of claim 1, wherein the resist features are removed following formation of the neutral orientation layer so that a complementary pattern free from neutral orientation layer is formed where the resist features have been removed.

6. The method of claim 5, wherein the resist features are removed by dissolution in an organic solvent.

7. The method of claim 5, wherein the resist features are laterally trimmed prior to application of the neutral orientation layer so that a dimension of features of the complementary pattern is correspondingly reduced in lateral extent.

8. The method of claim 5, wherein a selective orientation layer is applied to the surface prior to application of the resist features to the surface, the selective orientation layer having a chemical affinity for the self-assemblable polymer differing from that of the neutral orientation layer.

9. The method of claim 8, wherein the selective orientation layer is removed from the surface between the resist features prior to formation of the neutral orientation layer.

10. The method of claim 1, wherein the head group comprises a silane head group.

11. The method of claim 1, wherein the organic compound comprises 3-(p-methoxyphenyl)propyl trichlorosilane.

12. The method of claim 1, wherein such unbonded material is removed from the resist features, without substantially removing the resist features from the surface.

13. A method of forming a self-assembled polymer layer on a surface of a substrate, the method comprising:
providing a surface of a substrate, having a patterned neutral orientation layer thereon, by the method of claim 1;
depositing a self-assemblable polymer layer directly onto the neutral orientation layer to provide an interface between the self-assemblable polymer layer and the neutral orientation layer; and
treating the self-assemblable polymer layer to provide self-assembly into an ordered polymer layer at the interface.

14. The method of claim 13, wherein the self-assemblable polymer comprises first and second domain types and wherein the neutral orientation layer has chemical compatibility with both first and second domain types so that both first and second domain types are present at the interface.

15. A lithography method for patterning a surface of a substrate by resist etching, wherein the method comprises providing an ordered polymer layer at the surface by the method of claim 13, wherein the ordered polymer layer is used as a resist layer.

16. A method for forming a device topography at a surface of a substrate, the method comprising using the self-assembled polymer layer formed by the method of claim 13 as a resist layer while etching the substrate to provide the device topography.

* * * * *